United States Patent [19]

Nishimura

[11] Patent Number: 4,672,319

[45] Date of Patent: Jun. 9, 1987

[54] MULTIPLE PULSE EXCITATION IN NMR IMAGING

[75] Inventor: Dwight G. Nishimura, Palo Alto, Calif.

[73] Assignee: Stanford University, Stanford, Calif.

[21] Appl. No.: 652,139

[22] Filed: Sep. 19, 1984

[51] Int. Cl.⁴ ............................................ G01R 33/20
[52] U.S. Cl. .................................... 324/309; 324/312
[58] Field of Search ............... 324/300, 307, 309, 313, 324/314, 318, 322, 311

[56] References Cited

U.S. PATENT DOCUMENTS

| | | | |
|---|---|---|---|
| 4,065,714 | 12/1977 | Hill | 324/312 |
| 4,443,760 | 4/1984 | Edelstein et al. | 324/313 |
| 4,564,813 | 1/1986 | Young et al. | 324/309 |
| 4,613,949 | 9/1986 | Glover et al. | 324/307 X |

FOREIGN PATENT DOCUMENTS 2090982  7/1982  United Kingdom ............... 324/307

OTHER PUBLICATIONS

M. S. Silver et al., Selective Pulse Creation by Inverse Solution of the Bloch-Riccati Equation, Mag. Res. in Medicine, vol. 1, No. 2, 1984.

Primary Examiner—Stewart J. Levy
Assistant Examiner—Scott M. Oldham
Attorney, Agent, or Firm—Flehr, Hohbach, Test, Albritton & Herbert

[57] ABSTRACT

Improved nuclei excitation for NMR applications is provided by employing a sequence of RF pulses for exciting the nuclei. Non-linearities in pulse excitation are compensated by applying at least one additional RF pulse thereby improving slice definition and/or phase characteristics. In one application, one or more initial RF pulses establish an intermediate state for the nuclei from which the nuclei can be tilted to a final desired magnetic moment state by the application of a single RF pulse. The order of applying the magnetic pulses can be reversed when the flip/angle is 180 degrees.

13 Claims, 21 Drawing Figures

MULTIPLE PULSE EXCITATION IN NMR IMAGING

This invention relates generally to nuclear magnetic resonance (NMR) imaging, and more particularly the invention relates to the excitation of nuclei for subsequent detection of free induction decay (FID) signals emitted by the excited nuclei.

Nuclear magnetic resonance is a non-destruction method for the analysis of materials and represents a new approach to medical imaging. It is completely non-invasive and does not involve ionizing radiation. In very general terms, magnetic moments are excited at specific spin frequencies which are proportional to the local magnetic field. The radio frequency signals resulting from the decay of these spins are received using pickup coils. By manipulating the magnetic fields, an array of signals are provided representing different regions of the volume. These are combined to produce a volumetric image of the density of the body.

A descriptive series of papers on NMR appeared in the June 1980 issue of the *IEEE Transactions on Nuclear Science*, Vol. NS-27, pp. 1220-1255. The basic concepts are described in the lead article, "Introduction to the Principles of NMR" by W. V. House, pp. 1220-1226, which employ computed tomography reconstruction concepts for reconstructing cross-sectional images. A number of two and three-dimensional imaging methods are described. See P. Mansfield and P. G. Morris, *NMR Imaging in Biomedicine*, Academic Press, N.Y., 1982.

A strong static magnetic field is employed to establish along the field direction a net magnetic moment resulting from the nuclear spins of these atoms. A second magnetic field applied as a single RF pulse at right angles to the first, is then used to pump energy into these nuclei, flipping the magnetic moment over, for example to 90° or 180°. When the applied magnetic field is removed, the nuclei return in alignment with the static field and give up the energy in the form of weak but detectable free induction decay (FID) electromagnetic waves. These FID signals are used by a computer to produce images.

The excitation frequency, and the FID frequency, is defined by the Larmor relationship which states that the angular frequency $\omega_0$, of the precession of the nuclei is the product of the magnetic field, $H_0$, and the socalled magnetogyric ratio, $\gamma$, a fundamental physical constant for each nuclear species, given as:

$$\omega_0 = \gamma H_0.$$

Accordingly, by superimposing a gradient field, $G_Z$, on the static field, $H_0$, in the Z axis, for example, nuclei in a selected X-Y plane can be exited by proper choice of the frequency of the transverse excitation field applied along the X or Y axis. For convenience, axes are normally defined for a frame rotating about the static field axis at the frequency of the RF pulse. See for example, Hinshaw and Lent, "An Introduction to NMR Imaging: From the Bloch Equation to the Imaging Equation", *Proceedings of the IEEE*, Vol. 71, No. 3, March 1983 pp. 338-350). As used herein axes are defined in terms of such a rotating frame.

The guidelines for choosing the appropriate RF pulse envelope in a conventional selective excitation sequence often relies on Fourier analysis. However, Fourier analysis of the RF pulse envelope determines the resulting slice shape of the excited X-Y plane accurately only for small flip angle excitations, and not for larger flip angle excitations because of the generally non-linear behavior of the so-called nuclear spin system. Thus, the resultant magnetic moment distribution $M_x(x, y, z)$, $M_y(x, y, z)$, $M_z(x, y, z)$ usually falls short of what is desired. For example, in the 90° flip angle case, the slice profile often contains unwanted side lobes which degrade the spatial resolution. Further, the transverse component of the magnetic moments are usually not in phase over the excited slide (despite focusing) thereby reducing the signal level of the free induction decay (FID).

Accordingly, an object of the present invention is an improved method of exciting nuclei for subsequent detection of free induction decay (FID) signals emitted by the excited nuclei.

In accordance with the present invention an improved method for exciting nuclei through use of multiple excitation pulse is provided wherein slice definition is improved and/or magnetic moments are more in phase over the excited slice. With a static magnetic field and a gradient field imposed along a first axis (z) at least a first RF magnetic field pulse at the appropriate Larmor frequency having transverse (x, y components) is applied for flipping the magnetic moments into an intermediate state. The appropriate Larmor frequency is the frequency corresponding to the Larmor frequency of the nuclei in the selected region. A second RF magnetic field pulse at the Larmor frequency is applied along a transverse axis for flipping the magnetic moments from the intermediate state to the desired angle for subsequent signal detection. The first RF pulse compensates for imperfections in the magnetic moment distribution which would otherwise be present from the second RF pulse being applied alone.

The magnitude and axial content of the first magnetic field pulse or pulses is derived by first defining the desired field distribution for subsequent signal detection, and working backwards using the known Bloch equation for deriving the RF signal content necessary to achieve the desired magnetic moment distribution. See Hinshaw and Lent "An Introduction to NMR Imaging: From the Bloch Equation to the Imaging Equation", *Proceedings of the IEEE*, Vol. 71, No. 3, March 1983 pp. 338-350), supra. More particularly, the derived signal content is defined in terms of a plurality of pulses including the single RF pulse conventionally employed for spin excitation and compensating RF pulses to correct for errors introduced by the non-linear relationship between the conventional pulse and the resultant magnetic moment distribution which the Fourier transform guideline does not recognize. The use of one or more set-up excitation pulses to manipulate the magnetic moment distribution into an intermediate state is chosen for orderly and simple implementation. The second, conventional pulse then excites the intermediate distribution to yield the final improved distribution.

More particularly, the design procedure includes
1. Specifying a desired magnetic moment distribution and a conventional modulation function $H_1(t)$ for the main RF pulse. The modulation function is preferably made by relating the desired magnetic moment distribution and the modulation function by the Fourier transform.
2. Based on the desired distribution and the conventional modulation function, solve the Bloch equation backwards to determine the residual magnetic moment distribution. This residual distribution is the intermediate state that the first excitation pulse or pulses should set up.

3. Make a Fourier analysis of the transverse components of the residual distribution (or apodized version thereof) to determine the modulation function $H_{11}(t)$ for the first pulse.

4. If an additional pulse is to be used, then repeat steps 2 and 3 with step 2 modified to include both the conventional modulation function and the modulation function for the first pulse (or pulses).

In essence, $H_{11}(t)$ in a double pulse sequence acts to correct the imperfections implicit with the conventional $H_1(t)$. A third pulse can be applied before $H_{11}(t)$ based on the same rational to correct for any imperfections associated with a double pulse sequence. Additional pulses for further corrections can also be applied.

The invention encompasses other variations, including:

1. In the special case of 180° flip-angles, there exists a symmetry that allows the correction pulses to be applied after the conventional pulse $H_1(t)$.

2. As presented above, the Fourier analysis for small flip-angles allows design of the amplitude modulation function. However, it can also be used to determine the proper frequency modulation function along with the amplitude modulation function for the initial excitation pulse.

3. In certain cases such as with 90 degree flip-angles, a gradient reversal after the RF pulse plays an important role by focusing the phases of the magnetic moments. The design of the excitation pulses can take into account such a gradient reversal in the Fourier analysis. However, to minimize the amount of gradient switching and possibly excitation time, a reversed gradient during the RF pulse may be used so that the focusing gradient is the same polarity as that used for the next applied RF pulse. An opposite gradient polarity during say the first RF pulse of a double-pulse sequence may also eliminate the need of any focusing interval before the second RF pulse.

The invention and objects and features thereof will be more readily apparent from the following detailed description and appended claims when taken with the drawing, in which:

Figure 1A:
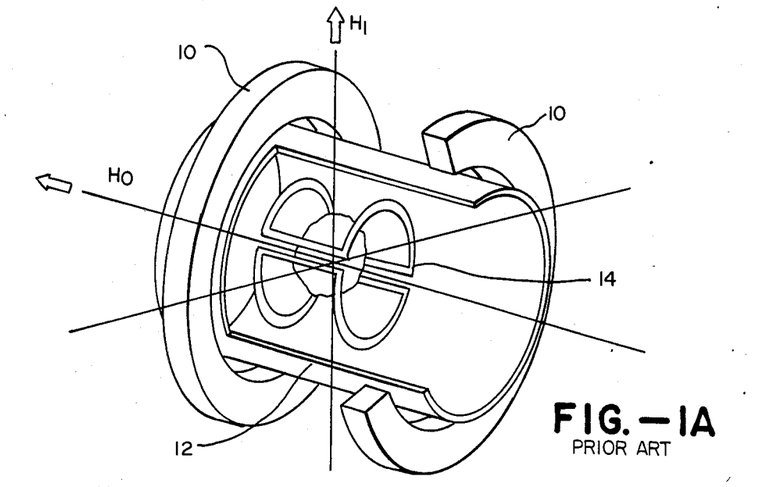
FIGS. 1A-1D illustrate an arrangement of NMR apparatus and magnetic fields generated therein in accordance with the prior art.
Figure 1B:
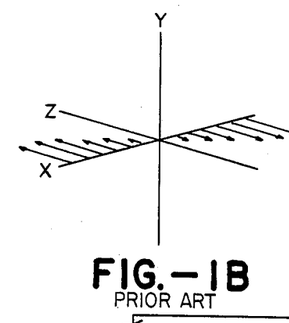
Figure 1C:
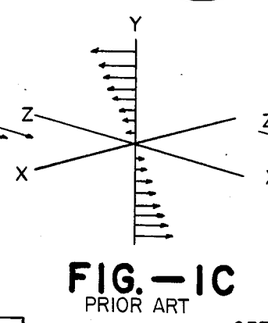
Figure 1D:
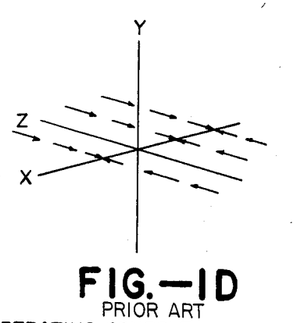

Referring now to the drawings, FIG. 1A is a perspective view partially in section illustrating coil apparatus in NMR imaging system, and FIGS. 1B-1D illustrate field gradients which can be produced in the apparatus of FIG. 1A. This apparatus is discussed by Hinshaw and Lent, "An Introduction to NMR Imaging: From the Bloch Equation to the Imaging Equation", supra. Briefly, the uniform static field $H_0$ is generated by the magnetic comprising the coil pair 10. A gradient field G is generated by a complex gradient coil set which can be wound on the cylinder 12. An RF field $H_1$ is generated by a saddle coil 14. A patient undergoing imaging would be positioned along the Z axis within the saddle coil 14.

In FIG. 1B an X gradient field is shown which is parallel to the static field $H_0$ and varies linearly with distance along the X axis but does not vary with distance along the Y or Z axes. FIGS. 1C and 1D are similar representations of the Y gradient and Z gradient fields, respectively.

Figure 2:
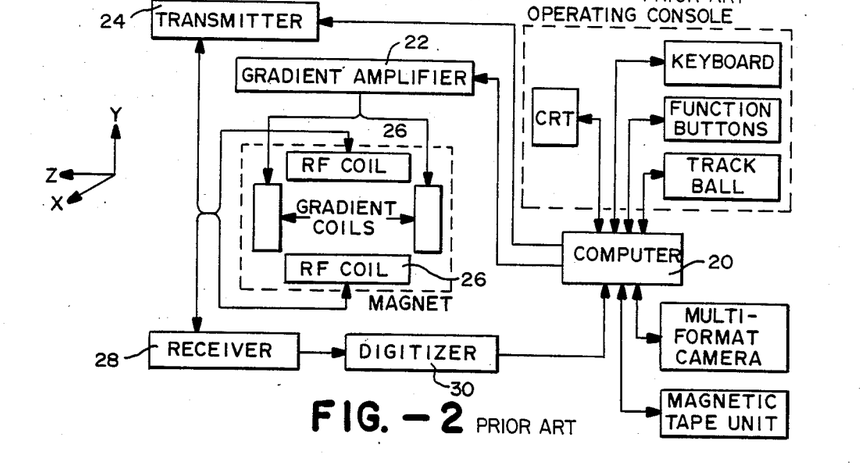
FIG. 2 is a functional block diagram of NMR imaging apparatus.

FIG. 2 is a functional block diagram of the imaging apparatus as disclosed in *NMR-A Perspective on Imaging*, General Electric Company 1982. A computer 20 is programmed to control the operation of the NMR apparatus and process FID signals detected therefrom. The gradient field is energized by a gradient amplifier 22, and the RF coils for impressing a RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

Figure 3:
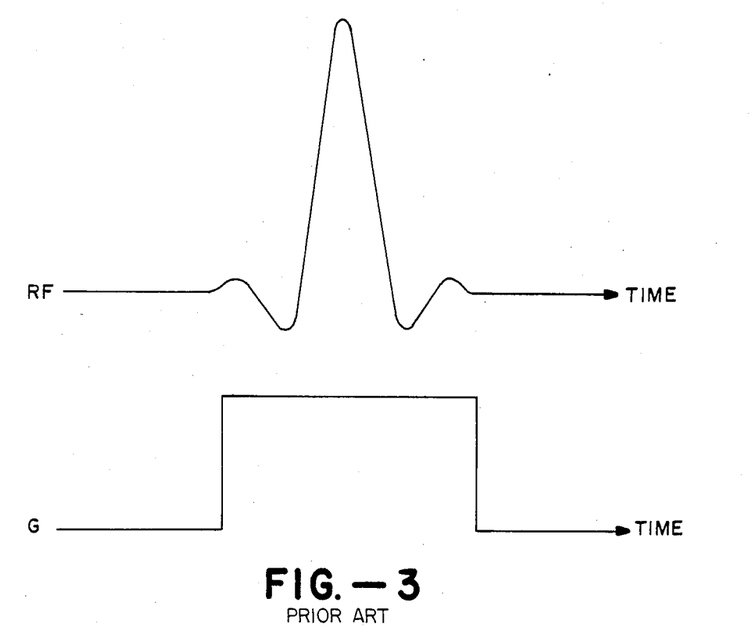
FIG. 3 shows the conventional RF pulse and gradient, $G_z$, as a function of time.

In conventional selective excitation systems used for NMR imaging, the radio-frequency (RF) magnetic field pulse, amplitude modulated by $H_1(t)$, is applied in the presence of a static gradient G (in addition to the main magnetic field $H_o$) to flip the magnetic moments located in a selectable slice, perpendicular to the direction of the gradient, by a specified flip-angle, typically 90 or 180 degrees. The RF pulse and gradient G are illustrated in FIG. 3. Often, the resultant magnetic moment distribution falls short of what is desired and results in undesired magnetic moment distribution along with the desired magnetic moment distribution. For example, in the case of a 90 degree flip-angle, the slice profile often contains unwanted sidelobes which degrade the spatial resolution. Further, the magnetic moments are typically not in-phase over the excited slice, thereby reducing the signal level.

The reason for the imperfections in the resultant distribution can be traced to the use of Fourier analysis that is often used to guide the selection of $H_1(t)$. With Fourier analysis, the basic reasoning is that the temporal frequency content of the applied excitation pulse should extend over the resonant frequency range of the desired slice as established by the gradient G. In addition, the magnitude of the frequency components should also be adjusted to induce the appropriate flip-angle over the slice. This Fourier transform guideline has good validity in the small flip-angle case where the magnetic moment distribution behaves linearly as required for Fourier analysis to apply. Overall, the Fourier transform guideline has limited utility because the behavior of the distribution, as accurately described by the Bloch equations is non-linear in general. Attempts to improve the excitation by modifying $H_1(t)$ using conventional Fourier transform techniques such as windowing lead to unpredictable results.

The excitation system in accordance with the invention employs multiple excitation pulses sequentially in the presence of a gradient instead of a single excitation pulse as performed conventionally. A double-pulse sequence will now be described, but three or more pulses can be employed in accordance with the invention.

Figure 4:
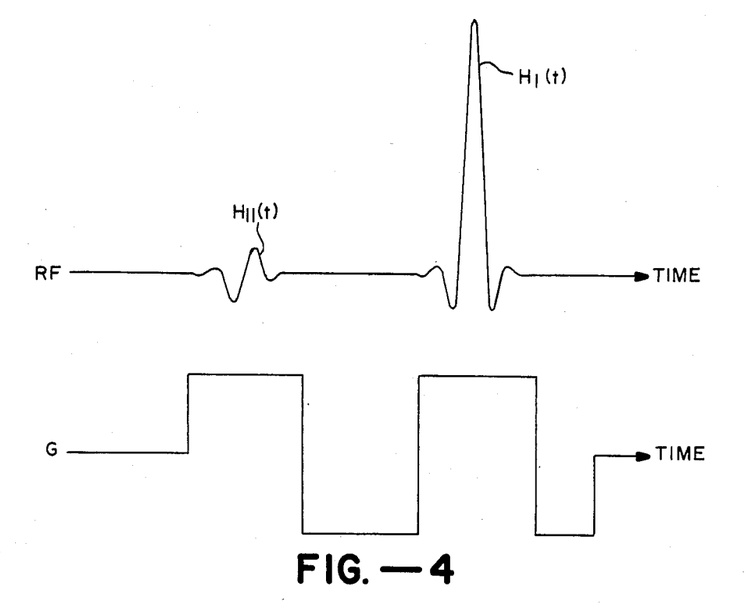
FIGS. 4 and 5 show a double pulse sequence and gradient in accordance with two embodiments of the invention.
Figure 5:
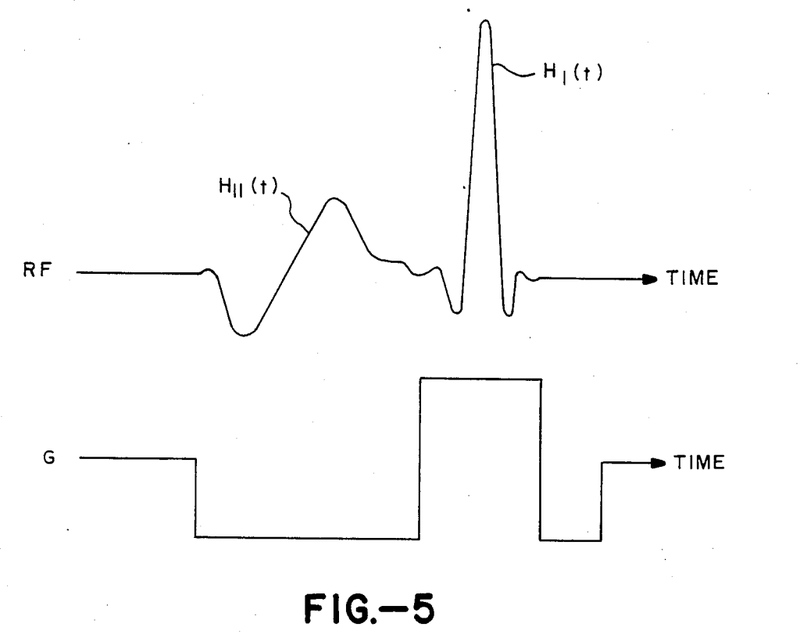

In a double-pulse sequence as described in FIGS. 4 and 5, a first "set-up" excitation pulse $H_{11}(t)$ is applied to manipulate the magnetic moment distribution into an intermediate state. The second pulse is a conventional pulse $H_1(t)$ which then excites the intermediate distribution to yield the final improved distribution. In FIG. 4 a focusing gradient is applied after $H_{11}$ and before $H_1$ is applied. The gradients during $H_{11}$ and $H_1$ are the same polarity but not necessarily the same magnitude. In FIG. 5 an alternate double pulse sequence has the gradients during $H_{11}$ and $H_1$ of opposite polarity. Again, the magnitudes are not necessarily the same. The focusing gradient after $H_{11}$ is of the same polarity as the gradient during $H_1$. A focusing gradient after $H_1$, may be employed as shown.

The relationship between the two pulses is made clear by working backwards from the desired final magnet moment distribution to the known starting magnetic moment distribution. An intermediate magnetic moment distribution represents the distribution that should exist in order for the second excitation pulse to give the desired output. Because the conventional pulses give output distributions that resemble their respective Fourier transforms, the intermediate distribution will not differ greatly from the actual starting distribution. Accordingly, the first pulse will induce only a small flip-angle to set up the proper intermediate magnetic moment distribution. In such a case, the Fourier transform guideline becomes a very accurate predictor. From the above arguments, a straightforward design procedure can be outlined:

1. Specify a desired final magnetic moment distribution and a conventional RF field modulation function for $H_1(t)$. A reasonable choice is to make them related by the Fourier transform.
2. Based on the desired distribution and the conventional modulation function, numerically solve the Bloch equations backwards to determine a residual spin distribution. This residual distribution is the intermediate state that the first excitation must establish.
3. Make a Fourier analysis of the transverse components of the residual distribution (or an apodized version thereof) to determine the modulation function $H_{11}(t)$. The apodizing function can lead to a better behaved transform, as is well known in the art.
4. If an additional pulse is to be used, then repeat steps 2 and 3 with step 2 modified to include both the conventional modulation function and the modulation function for the first pulse (or pulses).

In essence, $H_{11}(t)$ in the double-pulse sequence acts to correct the imperfections implicit with the conventional $H_1(t)$. A third pulse can be applied before $H_{11}(t)$ based on the same rationale to correct for any imperfections associated with the double-pulse sequence. Additional pulses for further corrections can also be applied.

Figure 6A:
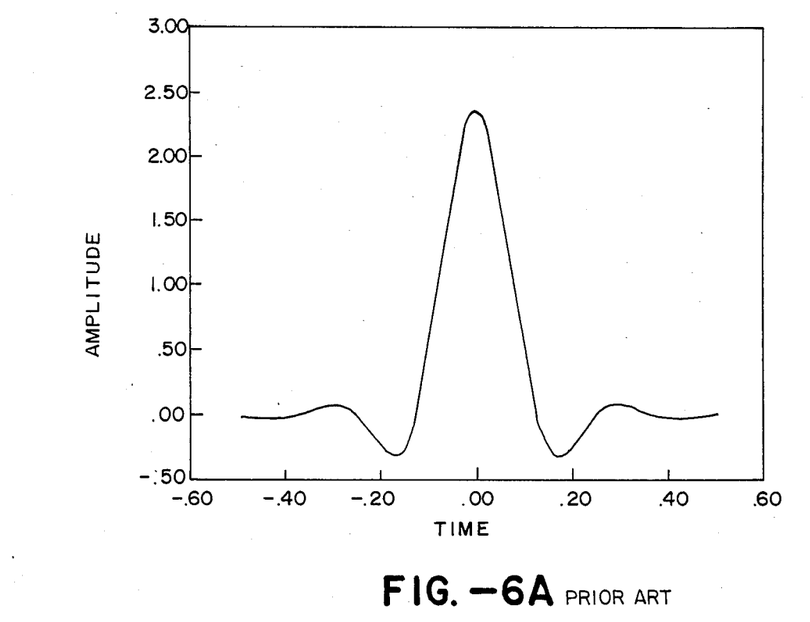
FIGS. 6A-6H illustrate pulse envelopes and resulting magnetic fields for a 90° flip of magnetic moments in a selected region.
Figure 6B:
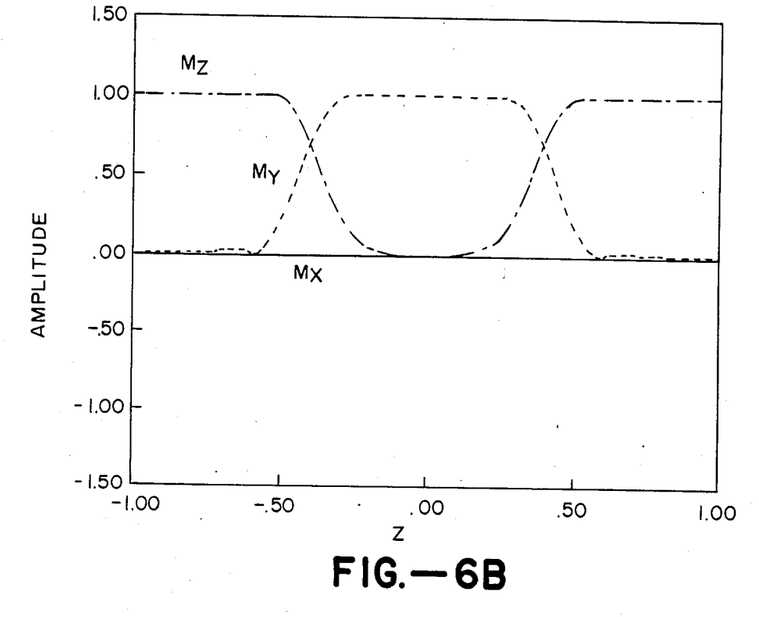

FIGS. 6A–6H illustrate the configuration of the RF pulse envelopes and the magnetic moments of the nuclei spins for a selective 90° flip. These drawings are based on arbitrary units and the assumption that the object being excited is homogeneous. In FIG. 6A a conventional pulse (for example, a sinc function windowed by a Gaussian function) for $H_1(t)$ is illustrated, and FIG. 6B is the resultant magnetic moment distribution which are desired for the flipped nuclei. In FIG. 6B it will be noted that the magnetic moment of the flipped nuclei becomes oriented along the Y axis in response to the modulation function and thereafter reorient along the Z axis after the FID signal is generated.

Figure 6C:
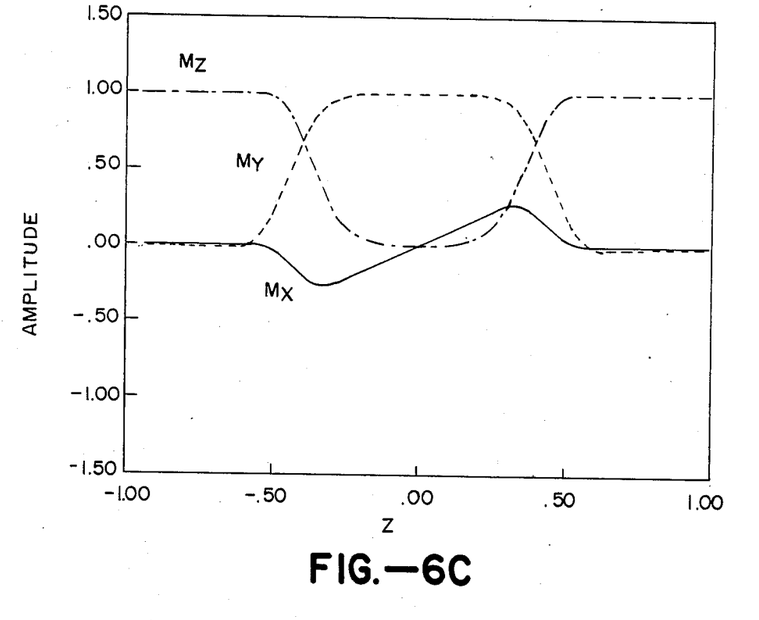

FIG. 6C shows the actual magnetic moment distribution of the nuclei in response to the Gaussian windowed sinc pulse of FIG. 6A and focusing with a reversed gradient, and it will be noted that a magnetic component along the X axis, $M_x(z)$, is present. As described above this is due to the non-linear relationship of the RF pulse and the resultant magnetic moment distribution of the flipped nuclei.

Figure 6D:
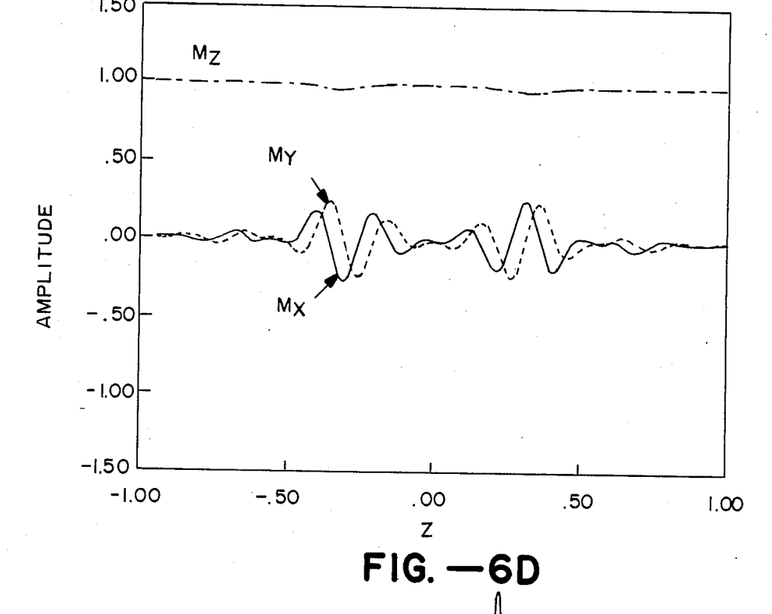
Figure 6E:
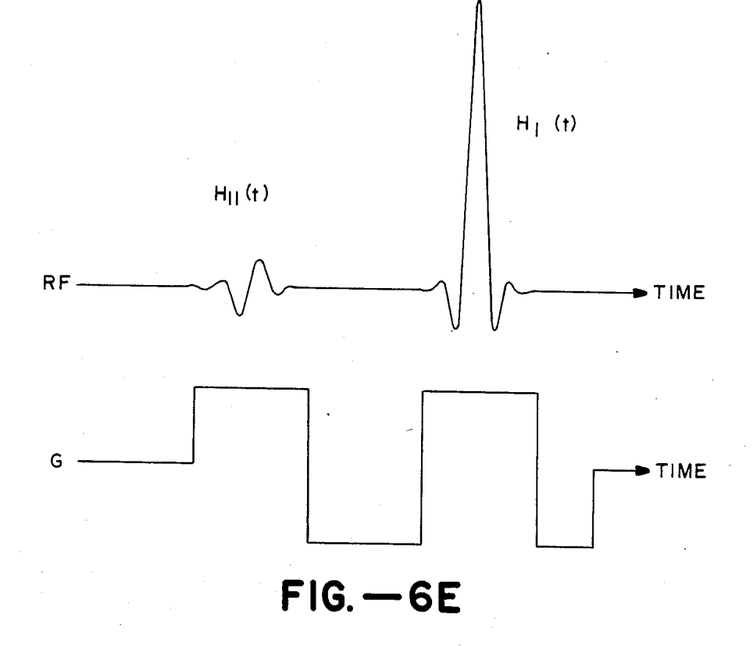
Figure 6F:
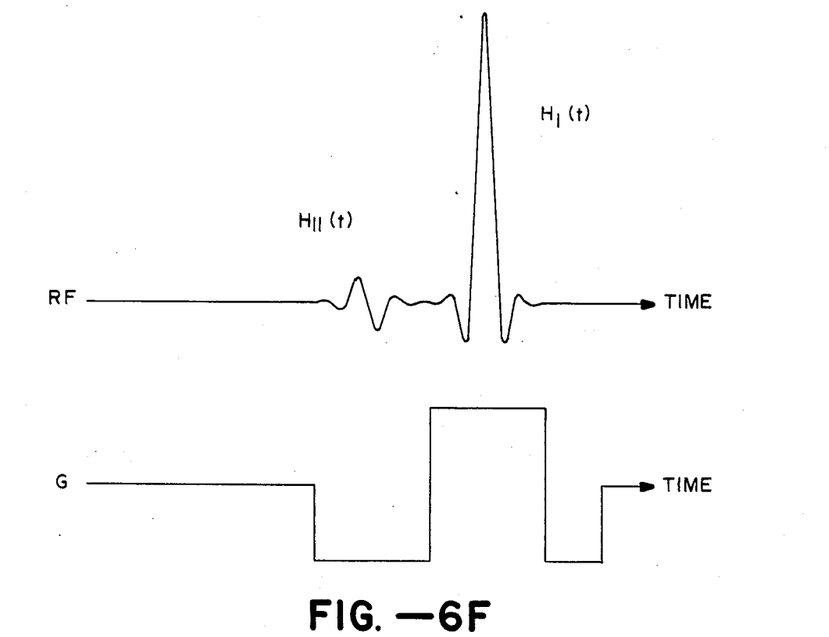
Figure 6G:
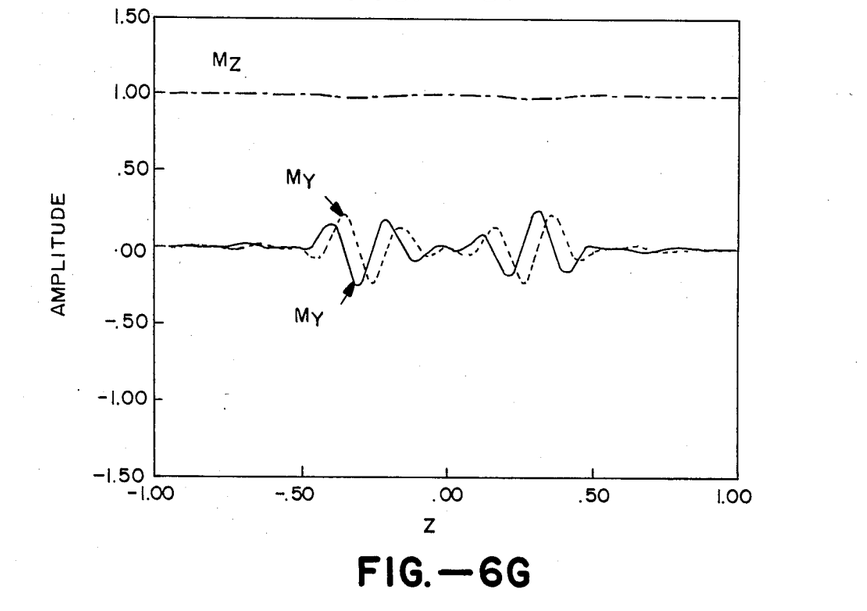
Figure 6H:
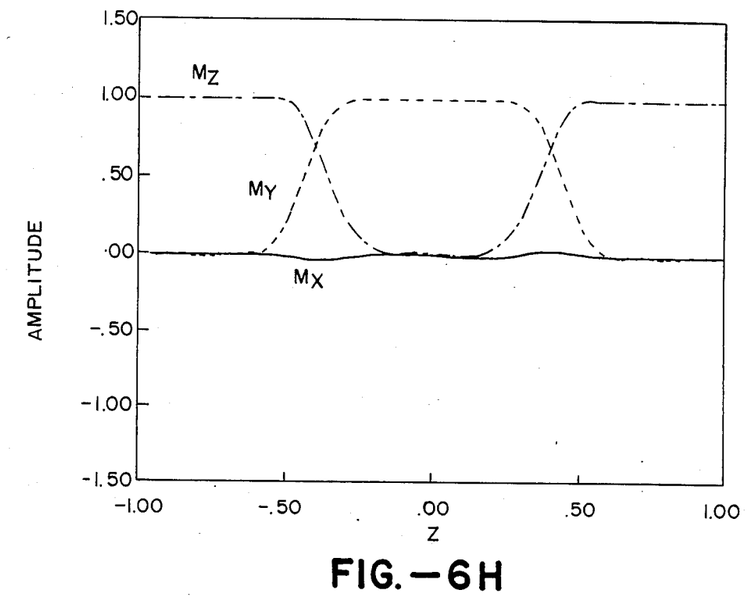

As described above, by starting with the desired magnetic moment characteristics of FIG. 6B and employing the Bloch equations, a residual or intermediate magnetic moment state is identified as shown in FIG. 6D. By Fourier analyzing the residual state, an initial pulse as shown in FIGS. 6E and 6F for the two embodiments described by FIGS. 4 and 5 can be identified. Thus by applying the prepulse sequence shown in either FIGS. 6E and 6F, the intermediate state shown in FIG. 6G is obtained. By then applying the $H_1$ signal to the nuclei in this magnetic moment state, the desired condition of FIG. 6H is obtained in which essentially no X axis magnetic moment is present and implying that the magnetic moments are inphase over the selected slice. Thus, by establishing the required intermediate state before applying the RF pulse, the desired magnetic moment of the flipped nuclei is obtained.

Figure 7A:
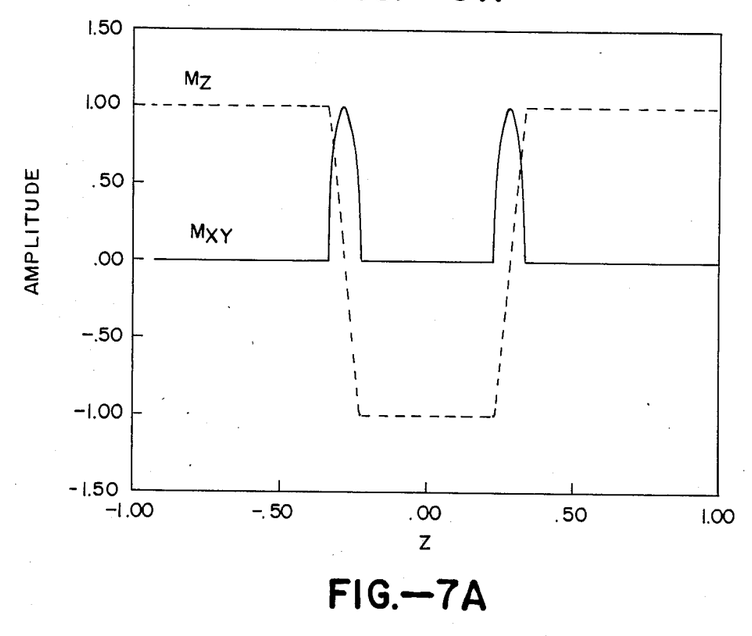
FIGS. 7A-7E illustrate the envelopes of magnetic pulse signals and resulting magnetic moments of nuclei for a 180° flip of the nuclei magnetic moments in a selected region.
Figure 7B:
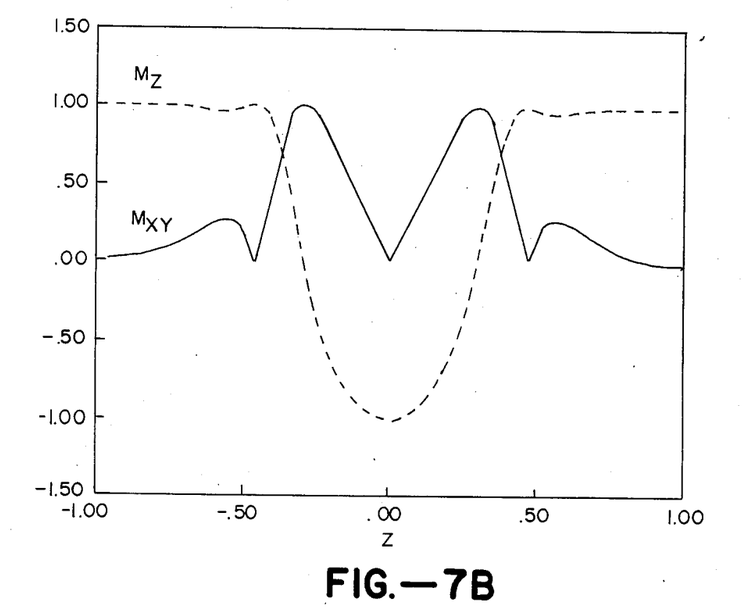

FIGS. 7A–7E illustrate the envelopes of magnetic RF pulse signals and resulting magnetic moments of nuclei for a selective 180° flip of the nuclei magnetic moments. The conventional pulse shape of FIG. 6A for $H_1(t)$ is considered. FIG. 7A is the desired resultant magnetic moment distribution which is desired for the flipped nuclei. However, FIG. 7B shows the actual resultant magnetic moment distribution resulting from $H_1(t)$ shown in FIG. 6A. The $M_z(z)$ curve in FIG. 7B shows poor slice definition and a significant $M_{xy}(z)$ component is present after the excitation.

Figure 7C:
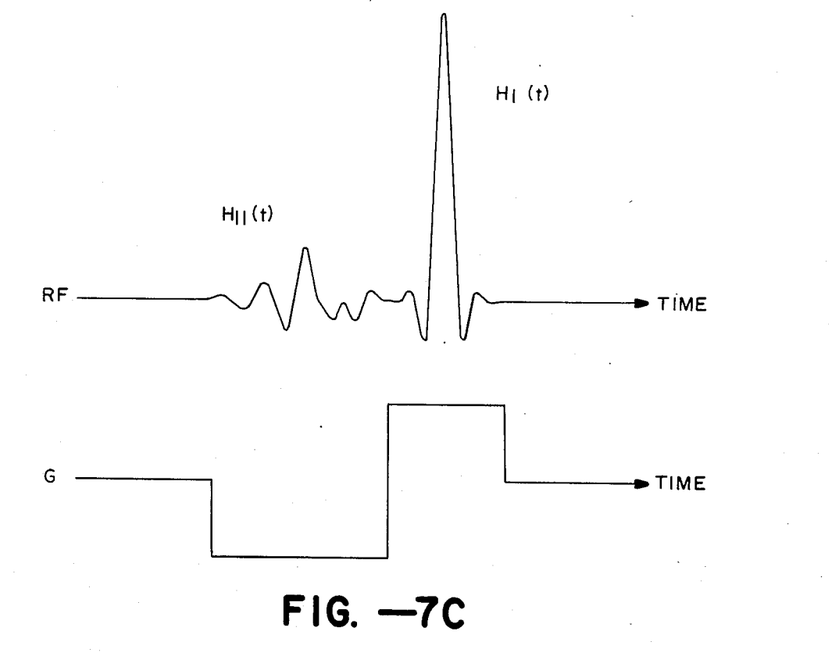
Figure 7D:
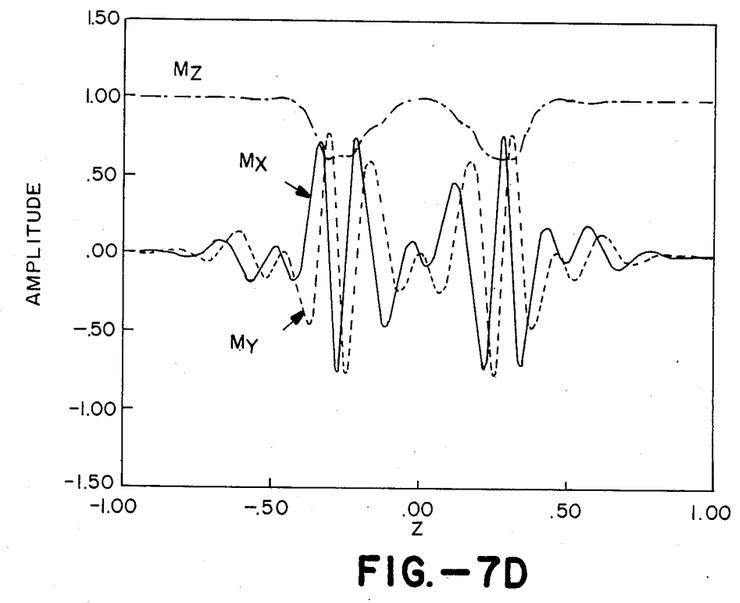
Figure 7E:
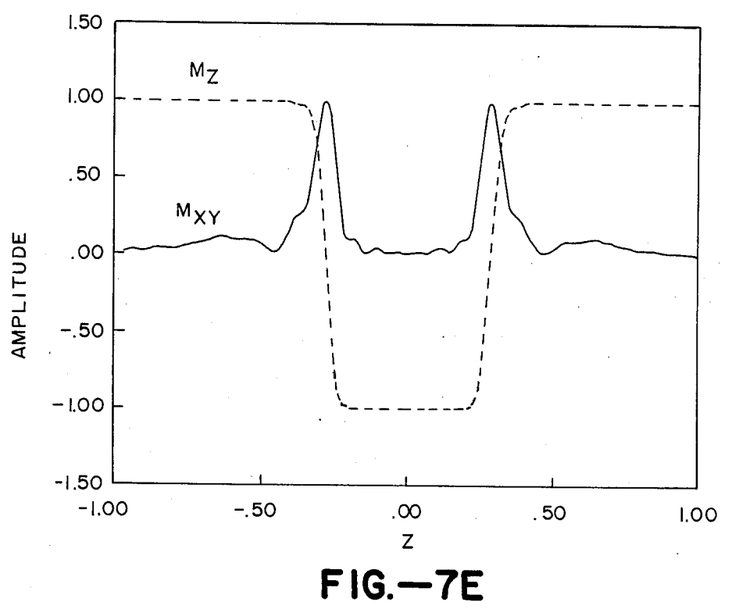

Using the technique described above, an initial pulse which compensates for the residual magnetic state is defined. FIG. 7C shows the initial pulse $H_{11}(t)$ and the conventional Gaussian-windowed sinc pulse $H_1(t)$ along with the magnetic gradient during the pulse periods. In this illustrative embodiment the gradients are reversed for the respective pulses. FIG. 7D illustrates the magnetic moment distribution after applying the $H_{11}(t)$ pulse, and FIG. 7E illustrates the magnetic moment distribution after both pulses are applied. It should be appreciated that the order of applying the $H_{11}(t)$ and $H_1(t)$ pulses can be reversed with the same resultant magnetic moment distribution, however, the shape of $H_{11}(t)$ must be modified.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:
1. For use in NMR imaging wherein a static magnetic field and a gradient magnetic field are imposed on nuclei along a first axis and a composite RF magnetic field at a Larmor frequency is imposed on said nuclei along a first transverse axis for exciting said nuclei and flipping the magnetic moments of said nuclei from the first axis by a desired angle, a method of exciting said nuclei with said composite RF magnetic field comprising the steps of imposing at least a first RF magnetic field at said Larmor frequency on said nuclei and thereby establishing an intermediate state of magnetic moment distribution, said first RF magnetic field functioning as a corrective field and being defined by Bloch equation using the configuration of a second RF magnetic field, the applied static and gradient field, and the desired magnetic moment distribution of the nuclei to establish a residual magnetic moment distribution for the nuclei, and Fourier analysis of said residual magnetic moment distribution, and imposing said second RF magnetic field at said Larmor frequency along said first transverse axis for flipping said nuclei from said intermediate state to a desired angle.

2. The method as defined by claim 1 wherein said Fourier analysis considers gradient polarity of the gradient magnetic field during the corrective field application.

3. The method as defined by claim 1 wherein said first RF magnetic field is imposed in the presence of a first gradient magnetic field and said second RF magnetic field is imposed in the presence of a second gradient magnetic field.

4. The method as defined by claim 3 wherein said first and second gradients have the same polarity.

5. The method as defined by claim 3 wherein said first and second gradients have opposite polarity.

6. For use in NMR imaging wherein a static magnetic field and a gradient magnetic field are imposed on nuclei along a first axis and an RF magnetic field at a Larmor frequency is imposed on said nuclei along a first transverse axis for exciting a selected region of said nuclei and flipping the magnetic moments of said nuclei from the first axis by a desired angle, a method of exciting said nuclei with the RF magnetic field comprising the steps of applying first and second pulsed magnetic excitations at said Larmor frequency, said first pulsed magnetic excitation flipping said nuclei and producing an undesired magnetic moment distribution in addition to a desired magnetic moment distribution, said second pulsed magnetic excitation compensating for said undesired magnetic moment distribution, said second pulsed magnetic excitation being defined by Bloch equation using the configuration of said first pulsed magnetic excitation and said RF magnetic field, said static magnetic field and said gradient magnetic field, and said desired magnetic moment distribution of said nuclei to establish a residual magnetic moment distribution, and Fourier analysis of said residual magnetic moment distribution.

7. Apparatus for use in NMR imaging comprising means for applying to nuclei a static magnetic field along a first axis, means for applying to said nuclei a gradient magnetic field along said first axis, means for applying to said nuclei at least a first RF magnetic field at a Larmor frequency along a transverse axis to establish an intermediate state of magnetic moment distribution of said nuclei, means for applying to said nuclei a second RF magnetic field at said Larmor frequency along said transverse axis for flipping said nuclei to a desired angle, said first RF magnetic field being defined by Bloch equation using the configuration of said second RF magnetic field, said static magnetic field, said gradient magnetic field, and a desired magnetic moment distribution of said nuclei to establish a residual magnetic moment distribution for said nuclei, and Fourier analysis of said residual magnetic moment distribution, and means for detecting an FID signal from said nuclei.

8. For use in NMR imaging, apparatus comprising means for applying first and second pulsed magnetic excitations at a Larmor frequency to nuclei, said first pulsed magnetic excitation flipping said nuclei and producing an undesired magnetic moment distribution in addition to a desired magnetic moment distribution, said second pulsed magnetic excitation compensating for said undesired magnetic moment distribution, said second pulsed magnetic excitation being defined by Bloch equation using the configuration of said first RF magnetic field, the applied static and gradient field, and the desired magnetic moment distribution of the nuclei to establish a residual magnetic moment distribution for the nuclei, and Fourier analysis of said residual magnetic moment distribution.

9. In NMR imaging a method for selectively exciting the magnetic moments of nuclei spins in a desired region comprising the steps of exciting said magnetic moments with an RF magnetic pulse in the presence of a first magnetic gradient field, and exciting said magnetic moments with at least a second RF magnetic pulse in the presence of a second magnetic gradient field, said second RF magnetic pulse having a waveform which corrects for errors introduced by non-linearities of said first excitation, said second RF magnetic pulse being defined by Bloch equation using the configuration of said first RF magnetic field, the applied static and gradient field, and the desired magnetic moment distribution of the nuclei to establish a residual magnetic moment distribution for the nuclei, and Fourier analysis of said residual magnetic moment distribution.

10. The method as defined by claim 9 wherein said first and second gradients have the same polarity.

11. The method as defined by claim 9 wherein said first and second gradients have opposite polarity.

12. For use in NMR imaging wherein a static magnetic field and a gradient magnetic field are imposed on nuclei along a first axis and an RF magnetic field at a Larmor frequency is imposed on said nuclei along a first transverse axis for exciting a selected region of said nuclei and flipping the magnetic moments of said nuclei from the first axis by a desired angle, a method of exciting said nuclei comprising the steps of applying first and second pulsed magnetic excitations at said Larmor frequency, said first pulsed magnetic excitation flipping said nuclei greater than 90° and approximating said desired angle and producing an undesired magnetic moment distribution in addition to a desired magnetic moment distribution, said second pulsed magnetic excitation compensating for said undesired magnetic moment distribution and effecting the flipping of said nuclei to said desired angle.

13. For use in NMR imaging, apparatus comprising means for applying first and second pulsed magnetic excitations at a Larmore frequency to nuclei, said first pulsed magnetic excitation flipping said nuclei greater than 90° and approximating a desired angle and producing an undesired magnetic moment distribution in addition to a desired magnetic moment distribution, said second pulsed magnetic excitation compensating for said undesired magnetic moment distribution and effecting the flipping of said nuclei to said desired angle.

* * * * *